United States Patent [19]

Tsai

[11] Patent Number: 6,114,220
[45] Date of Patent: Sep. 5, 2000

[54] METHOD OF FABRICATING A SHALLOW TRENCH ISOLATION

[75] Inventor: Meng-Jin Tsai, Hsinchu Hsien, Taiwan

[73] Assignee: United Microelectronics Corp., Hsinchu, Taiwan

[21] Appl. No.: 09/195,226

[22] Filed: Nov. 18, 1998

[51] Int. Cl.[7] .................................................... H01L 21/76
[52] U.S. Cl. ........................ 438/435; 438/424; 438/437; 148/DIG. 50
[58] Field of Search .................................... 438/296, 424, 438/427, 428, 435, 437; 148/DIG. 50

[56] References Cited

U.S. PATENT DOCUMENTS

| | | |
|---|---|---|
| 4,836,885 | 6/1989 | Breiten et al. . |
| 5,077,234 | 12/1991 | Scoopo et al. . |
| 5,175,122 | 12/1992 | Wang et al. . |
| 5,435,888 | 7/1995 | Kalnitsky et al. . |
| 5,691,215 | 11/1997 | Dai et al. . |
| 5,728,621 | 3/1998 | Zheng et al. .............................. 438/424 |

*Primary Examiner*—Trung Dang
*Attorney, Agent, or Firm*—Oblon, Spivak, McClelland, Maier & Neustadt, P.C.

[57] ABSTRACT

A method of fabricating a shallow trench isolation includes formation of a trench in a substrate. An oxide layer is formed on the substrate to fill the trench. A barrier layer and a coating layer are formed in sequence over the substrate. A first etching step is performed to remove a portion of the coating layer and the oxide layer to at least expose the oxide layer on the mask layer. A second etching step is performed to remove the other portion of the coating layer and the oxide layer until exposing the mask layer. Thus, microscratches and defects do not happen and thus the invention prevents the occurrence of bridging effect and short circuits.

19 Claims, 4 Drawing Sheets

METHOD OF FABRICATING A SHALLOW TRENCH ISOLATION

BACKGROUND OF THE INVENTION

1. Field of the Invention

The present invention relates to a semiconductor fabricating method. More particularly, the present invention relates to a method of forming an isolation region.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, local oxidation of silicon (LOCOS) technique is widely utilized in semiconductor industry to provide isolation regions among the various devices in the substrate. Since the LOCOS technique has been used for some time, it is one of the most reliable and low cost method for fabricating device isolation regions. However, there are still some drawbacks of the LOCOS. The drawbacks include internal stress generation and bird's beak encroachment. For a high-integrated circuit, the problem of the bird's beak encroachment of the isolation regions especially cannot be avoided, thus isolation regions cannot effectively isolate devices.

Shallow trench isolation (STI) technique is also a common conventional method of forming isolation regions. Shallow trench isolation is formed by using anisotropic etching at first to form a trench in the substrate, and then depositing oxide in the trench to form an isolation region having its top surface levels with the substrate surface.

FIGS. 1 through 5 are cross-sectional views showing a conventional method of fabricating a shallow trench isolation. FIG. 6 is a top view of FIG. 5.

In FIG. 1, a pad oxide layer 22 is formed on a substrate 10. A silicon nitride layer 24 is formed on the pad oxide layer 22 by using chemical vapor deposition. A patterned photoresist layer 28 is formed on the silicon nitride layer 24. The patterned photoresist layer 28 is used as a mask to etch the silicon nitride 24, the pad oxide layer 22, and the substrate 10 by using conventional photolithography process. A trench 30 is formed in the substrate 10. The patterned photoresist layer 28 is removed.

In FIG. 2, a thermal oxidation step is performed. A liner oxide layer 31 is formed on the sidewall of the trench 30 and conformal to the trench 30. A tetra-ethyl-ortho-silicon (TEOS) layer 32 is formed over the substrate to fill the trench 30 by using atmosphere-pressure chemical vapor deposition. A densification step is performed to densify the TEOS layer 32 at a temperature of about 1000° C. for 10 to 30 minutes to turn the TEOS layer into a more compact layer.

In FIG. 3, a portion of the TEOS layer 32 on the silicon nitride layer 24 is removed by using chemical mechanical polishing. The silicon nitride layer 24 is used as an etching stop layer. An oxide plug 34 is formed in the trench 30. However, slurry used during the chemical mechanical polishing (CMP) step easily scratches the TEOS layer 32. Therefore, defects and micro-scratches 25 easily occur in the surface of oxide plug 34, when performing the step of chemical mechanical polishing.

In FIG. 4, a hot phosphoric acid is used to remove the silicon nitride layer 24.

In FIG. 5, the pad oxide layer 22 is removed by immersion in a hydrofluoric (HF) acid solution. Since the TEOS layer 34 has a higher etching rate than the pad oxide layer 22, the thickness of oxide plug 34 removed is higher than pad oxide layer 22. Therefore, the top surface of the oxide plug 34 is leveled with the substrate 10 surface. Still, the oxide plug 34 has a lot of defects and micro-scratches 35 in its surface. The top view of the structure described above is shown in FIG. 6. FIGS. 1 through 5 are cross-sectional views of FIG. 6 taken along I—I.

In the conventional process, the defects and micro-scratches 35 generated during the CMP step lead to a kink effect that further causes short circuits or current leakage. If the defects and micro-scratches 35 on the top of the oxide plug 34 connect the neighboring devices, bridging effect or short circuit problems may occur. Therefore, the defects and micro-scratches 35 on the isolation plug 34 seriously reduce the yield.

SUMMARY OF THE INVENTION

It is therefore an objective of the present invention to provide a method of forming a shallow trench isolation that avoids micro-scratches and defects, which is generated by a CMP step on an oxide plug, and thus prevents the occurrence of bridging effect and short circuits.

To achieve these and other advantages and in accordance with the purpose of the invention, as embodied and broadly described herein, the invention provides a method of fabricating a shallow trench isolation. This invention includes the steps of forming a trench in a substrate and forming an oxide layer over the substrate to fill the trench. A barrier layer is formed on the oxide layer. A coating layer is formed on the barrier layer. A densification step is performed. An etching step is performed. A portion of the coating layer, the barrier layer, the oxide layer are etched to at least expose the oxide layer is exposed. The other etching step is performed to remove the other portion of the coating layer, the barrier layer, and the oxide layer until exposing the mask layer. The mask layer is removed. The pad oxide layer and a portion of the remaining oxide layer are removed. An oxide plug is formed. The top surface of the oxide plug is leveled with the surface of the substrate.

In contrast with the conventional method, which uses chemical mechanical polishing, the etching steps are performed in the invention. The defects and micro-scratches do not occur in the surface of the oxide layer. Thus, the present invention prevents the occurrence of bridging effect and short circuits.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
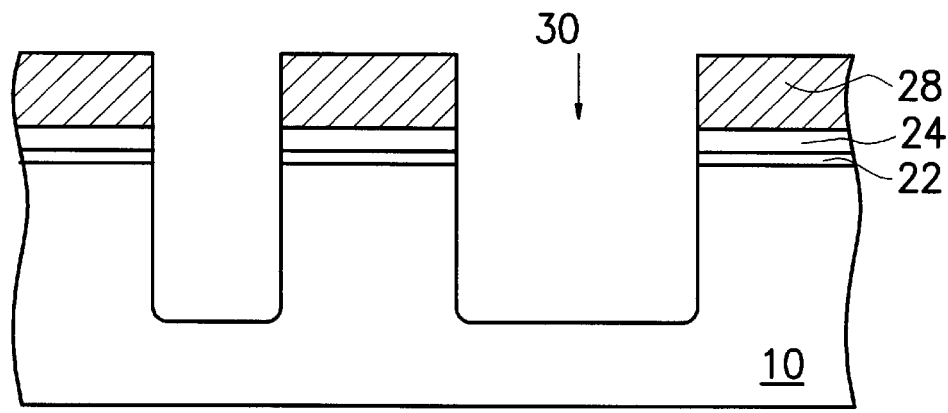
FIGS. 1 through 5 are cross-sectional views showing a conventional method of fabricating a shallow trench isolation.
Figure 2:
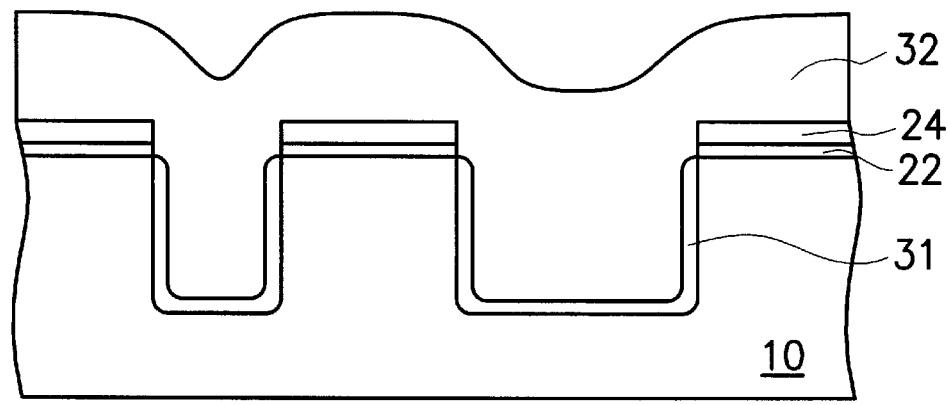
Figure 3:
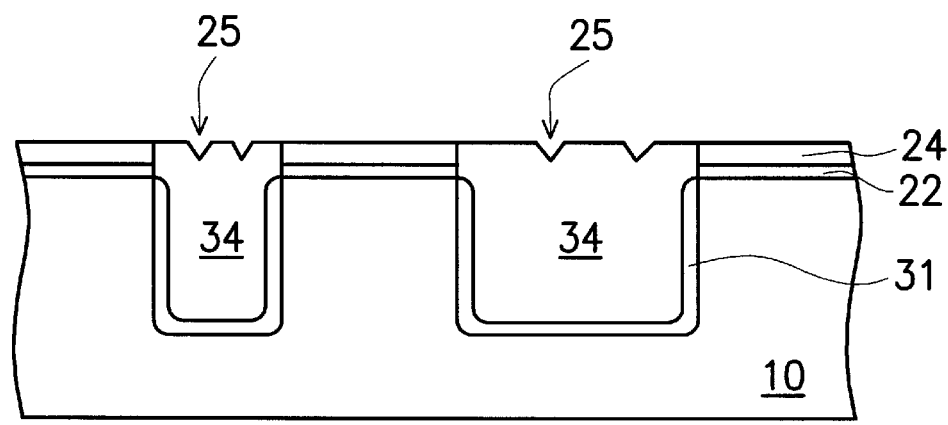
Figure 4:
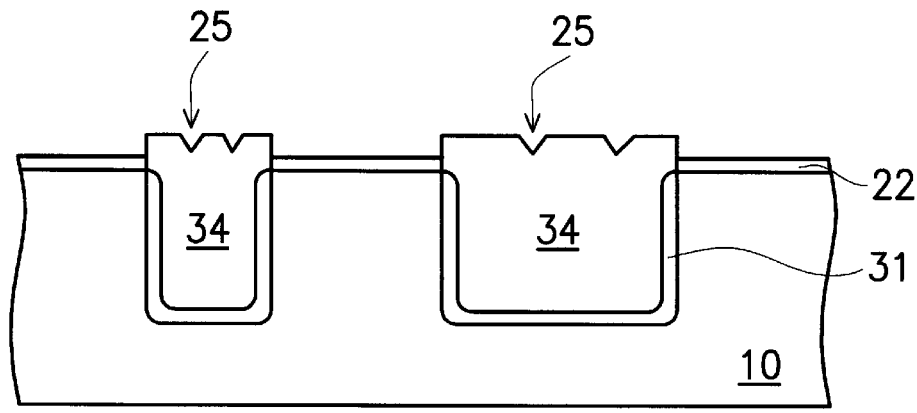
Figure 5:
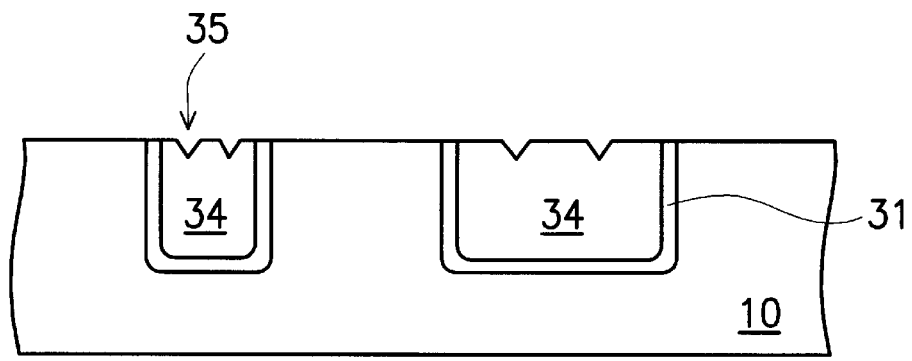
Figure 6:
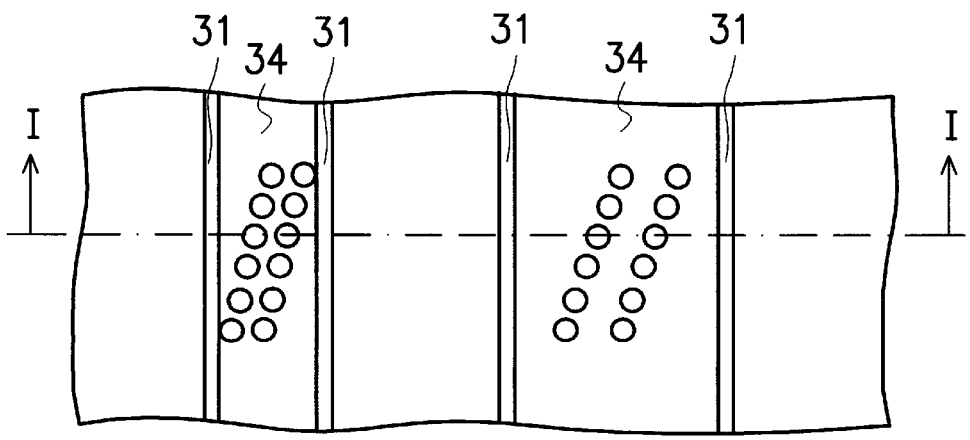
FIG. 6 is a top view of FIG. 5.

Reference will now be made in detail to the present preferred embodiments of the invention, examples of which are illustrated in the accompanying drawings. Wherever possible, the same reference numbers are used in the drawings and the description to refer to the same or like parts.

FIGS. 7 through 10 are cross-sectional views showing a method of fabricating a shallow trench isolation according to one preferred embodiment of the invention. FIG. 11 is a top view of FIG. 10.

Figure 7:
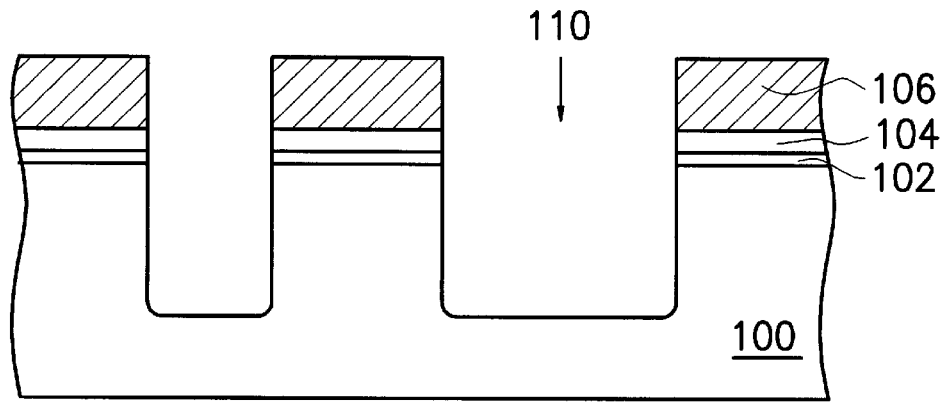
FIGS. 7 through 10 are cross-sectional views showing a method of fabricating a shallow trench isolation according to one preferred embodiment of the invention.

In FIG. 7, a pad oxide layer 102 is formed on a semiconductor substrate 100. The pad oxide layer 102 is used to protect the substrate 100. The pad oxide layer 102 having a thickness of about 50 Å to 500 Å can be formed by using thermal oxidation. A mask layer 104 is formed on the pad oxide layer 102 by using chemical vapor deposition. The material of the mask layer 104 includes silicon nitride.

A pattern photoresist layer 106 is formed on the mask layer 104. An etching step is performed to etch the mask layer 104, the pad oxide layer 102, and the substrate 100 to form a trench 110 in the substrate 100. The etching step is performed by using dry etching or wet etching, for example. In general, an anisotropic etching step is performed to form the trench 110 in the substrate having a depth of about 2000 Å to 5000 Å.

Figure 8:
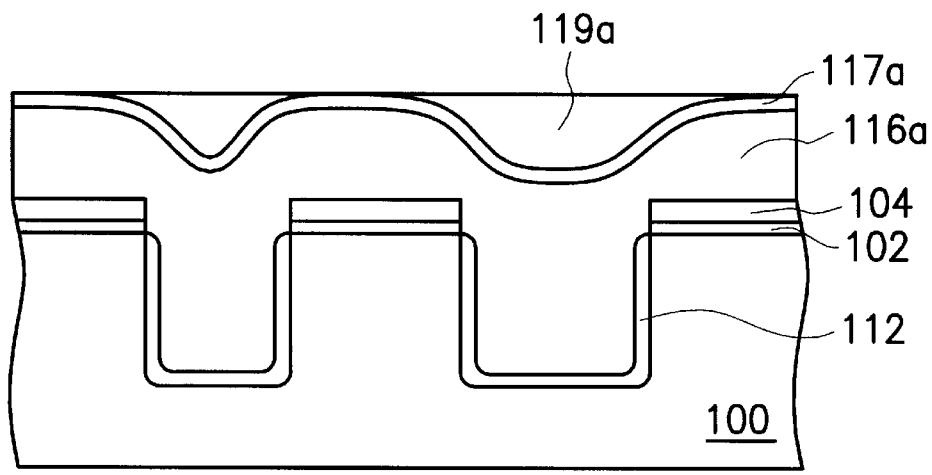

In FIG. 8, the photoresist layer 106 is removed. A liner oxide layer 112 is formed on the substrate 100 exposed by the trench 110. The method of forming the liner oxide layer 112 can be thermal oxidation, for example. An oxide layer 116a is formed over the substrate 100 to fill the trench 110 by using chemical vapor deposition.

A barrier layer 117a is formed on the oxide layer 116a. The material of the barrier layer includes silicon nitride. A coating layer 119a is formed on the barrier layer 117a. The coating layer 119a has a good fluidity thus it is used to provide a planarized surface over the substrate 100. Using the coating layer 119a is one of the characteristics of the invention. The barrier layer 117a isolates the coating layer 119a from the oxide layer 116a in order to prevent the coating layer 119a from polluting the oxide layer 116a. The coating layer 119a can be a photoresist layer, a spin-on glass layer, or other layers that can provide a planarized surface. A densification step is performed at a temperature of about 1000° C. for 10 to 30 minutes. The oxide layer 116a becomes more compact after the densification step.

In the embodiment described above, the step of forming the barrier layer 117a can be omitted. The coating layer 119a can just formed on the oxide layer 116a to provide a planarized surface over the substrate 100.

Figure 9:
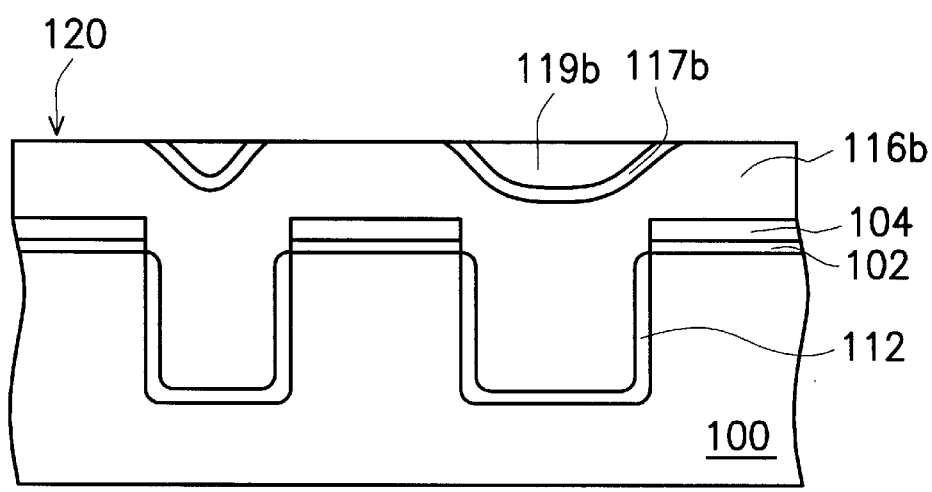

In FIG. 9, an etching step is performed. The etching step can be performed by wet etching or dry etching, for example. The coating layer 119a, the barrier layer 117a, the oxide layer 116a are etched to at least expose the oxide layer 106a on the mask layer 104. Therefore, a coating layer 119b, a barrier layer 117b, and an oxide layer 116b formed. A planarized surface 120 is obtained over the substrate 100. In contrast with the conventional method, which uses chemical mechanical polishing, the etching step is performed in the invention. The defects and micro-scratches do not occur in the surface of the oxide layer 116b.

Figure 10:
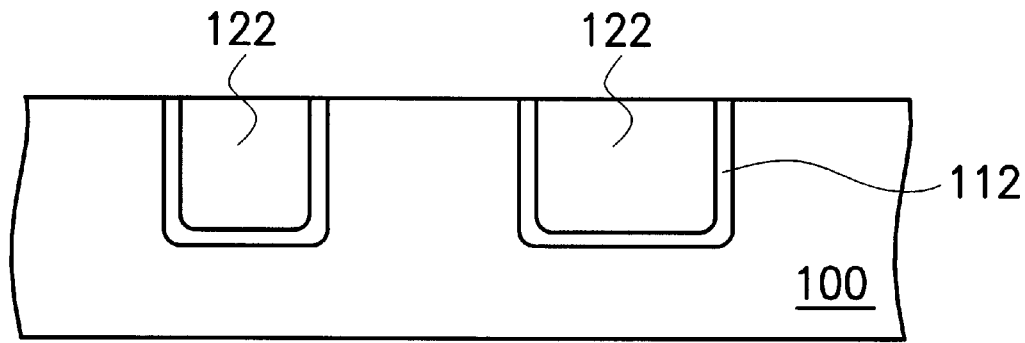
Figure 11:
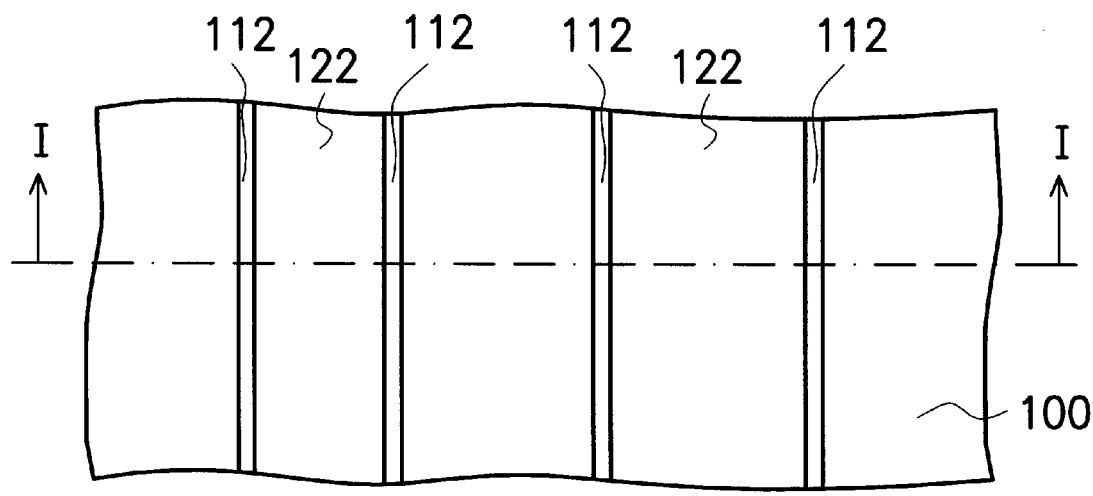
FIG. 11 is a top view of FIG. 10.

In FIG. 10, an etching step is performed to remove the coating layer 119b, the barrier layer 117b, and the oxide layer 116b until exposing the mask layer 104. The etching step can be performed by dry etching, for example. Preferably, the etching rates for the coating layer 119b, the barrier layer 117b, and the oxide layer 116b are close or the same, or at least the etching rates for the barrier layer 117b, and coating layer 119b are close, or the same. The mask layer 104 is removed by wet etching, in which a hot $H_3PO_4$ solution is used, for example. The pad oxide layer 102 and a portion of the oxide layer 116b are removed by a hydrofluoric (HF) acid solution. Typically, the etching rate of the oxide layer 116b is higher than the etching rate of the pad oxide layer 102 since these two oxide layers are formed by different method. Thus, the thickness of the oxide layer 116b to be removed is larger than the thickness of the pad oxide layer 102. An oxide plug 122 is formed. The top surface of the oxide plug 122 is leveled with the surface of the substrate 100. The top view of the structure described above is shown in FIG. 11. FIGS 7 through 10 are cross-sectional views taken along line I—I of FIG. 11.

In summary, the characteristics of the invention include the following:

1. In the present invention, the coating layer 119a is formed on the barrier layer 117a. The coating layer 119a has a good fluidity thus it is used to provide a planarized surface over the substrate 100.

2. In contrast with the conventional method, which uses chemical mechanical polishing, the etching steps are performed in the invention. The defects and micro-scratches do not occur in the surface of the oxide layer 116b. Thus, the present invention prevents the occurrence of bridging effect and short circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation, comprising the steps of:

forming a mask layer on a substrate;

patterning the mask layer and the substrate to form a trench in the substrate;

forming a liner oxide layer on a portion of the substrate exposed by the trench;

forming an oxide layer to fill the trench and cover the mask layer;

forming a coating layer over the oxide layer;

performing a first etching step including wet etching to remove a portion of the coating layer and the oxide layer to at least expose the oxide layer on the mask layer;

performing a second etching step to remove the other portion of the coating layer and the oxide layer until exposing the mask layer; and removing the mask layer until exposing the substrate.

2. The method of claim 1, wherein the mask layer includes a silicon nitride layer.

3. The method of claim 1, wherein the coating layer includes a photoresist layer.

4. The method of claim 1, wherein the coating layer includes a spin-on glass layer.

5. The method of claim 1, wherein the first etching step includes dry etching.

6. A method of fabricating a shallow trench isolation, comprising the steps of:

forming a mask layer on a substrate;

patterning the mask layer and the substrate to form a trench in the substrate;

forming a liner oxide layer on a portion of the substrate exposed by the trench;

forming an oxide layer to fill the trench and cover the mask layer;

forming a coating layer over the oxide layer;

performing a first etching step to remove a portion of the coating layer and the oxide layer to at least expose the oxide layer on the mask layer;

performing a second etching step to remove the other portion of the coating layer and the oxide layer until exposing the mask layer; and removing the mask layer until exposing the substrate, wherein the second etching step includes dry etching.

7. The method of claim 6, wherein the etching rates of the coating layer and the oxide layer in said first and second etching steps are close.

8. The method of claim 6, wherein the etching rates of the coating layer and the oxide layer in said first and second etching steps are the same.

9. The method of claim 1, further comprising forming a barrier layer between the oxide layer and the coating layer before the step of forming the coating layer.

10. The method of claim 9, wherein the barrier layer includes a silicon nitride layer.

11. The method of claim 9, wherein the first etching step further includes removing a portion of the coating layer, the barrier layer, and the oxide layer until exposing the oxide layer on the mask.

12. The method of claim 9, wherein the second etching step further includes removing the other portion of the coating layer, the barrier layer, and the oxide layer until exposing the mask.

13. The method of claim 9, wherein etching rates of the coating layer, and the barrier layer are the same.

14. The method of claim 9, wherein etching rates of the coating layer, and the barrier layer are close.

15. The method of claim 9, wherein etching rates of the coating layer, the barrier layer, and the oxide layer are the same.

16. The method of claim 9, wherein etching rates of the coating layer, the barrier layer, and the oxide layer are close.

17. A method of fabricating a shallow trench isolation, comprising the steps of:

forming a first silicon nitride layer on a substrate;

patterning the first silicon nitride layer to form a trench in the substrate;

forming an oxide layer to fill the trench and cover the first silicon nitride layer;

forming a second silicon nitride layer as a barrier layer on the oxide layer;

forming a coating layer on the barrier layer;

performing a first etching step to remove a portion of the coating layer, the second silicon nitride, and the oxide layer to at least expose the oxide layer on the first silicon nitride layer;

performing a second etching step to remove the other portion of the coating layer, the second silicon nitride layer, and the oxide layer until exposing the first silicon nitride layer; and removing the first silicon nitride layer until exposing the substrate.

18. The method of claim 17, wherein the etching rates of the coating layer and the second silicon nitride layer are the same.

19. The method of claim 17, wherein the etching rates of the coating layer and the second silicon nitride layer are close.

* * * * *